United States Patent
Yang

(10) Patent No.: US 9,830,996 B2
(45) Date of Patent: Nov. 28, 2017

(54) EFUSE BIT CELL, AND READ/WRITE METHOD THEREOF, AND EFUSE ARRAY

(71) Applicants: Semiconductor Manufacturing International (Shanghai) Corporation, Shanghai (CN); Semiconductor Manufacturing International (Beijing) Corporation, Beijing (CN)

(72) Inventor: Chia Chi Yang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/333,894

(22) Filed: Oct. 25, 2016

(65) Prior Publication Data
US 2017/0117059 A1   Apr. 27, 2017

(30) Foreign Application Priority Data
Oct. 27, 2015   (CN) .......................... 2015 1 0707364

(51) Int. Cl.
| G11C 17/00 | (2006.01) |
| G11C 17/18 | (2006.01) |
| G11C 17/16 | (2006.01) |

(52) U.S. Cl.
CPC ............ *G11C 17/18* (2013.01); *G11C 17/165* (2013.01)

(58) Field of Classification Search
CPC ........ G11C 17/16; G11C 17/18; G11C 17/165
USPC ................................................. 365/96, 225.7
See application file for complete search history.

(56) References Cited

U.S. PATENT DOCUMENTS

| 8,644,049 B2 * | 2/2014 | Chung ................ G11C 11/1659 365/100 |
| 2004/0105301 A1 | 6/2004 | Toyoda et al. |
| 2004/0227562 A1 | 11/2004 | Kuroki |
| 2005/0280495 A1 | 12/2005 | Douzaka et al. |
| 2012/0320658 A1 | 12/2012 | Wang |

* cited by examiner

*Primary Examiner* — Huan Hoang
(74) *Attorney, Agent, or Firm* — Anova Law Group, PLLC

(57) ABSTRACT

The present disclosure provides Efuse bit cells and read/write methods thereof, and Efuse arrays. An exemplary Efuse bit cell includes a data latch configured to latch data of the Efuse bit cell, having two branches with a fuse disposed in a first branch and a resistor disposed in a second branch; a selection controller configured to control connections between one terminal of the first branch and a power source and between one terminal of the second branch and the power source, another terminal of the first branch and another terminal of the second branch being connected to ground; a first diode and a second diode, one of the first diode and the second diode being configured to input a write data signal; and a pass unit configured to transmit data stored in the Efuse bit cell and output a bit line signal.

20 Claims, 6 Drawing Sheets

EFUSE BIT CELL, AND READ/WRITE METHOD THEREOF, AND EFUSE ARRAY

CROSS-REFERENCES TO RELATED APPLICATIONS

This application claims the priority of Chinese patent application No 201510707364.8, filed on Oct. 27, 2015, the entirety of which is incorporated herein by reference.

FIELD OF THE INVENTION

The present invention generally relates to the field of semiconductor circuit design technology and, more particularly, relates to Efuse bit cells and read/write methods thereof, and Efuse arrays.

BACKGROUND

Efuses, as a type of one time program (OTP) devices, may be programmed to store data. Static random access memories (SRAMs) are one of the common types of memory, which utilize a static access method, and use bistable data latching circuits as memory cells. SRAMs have a high read speed. The efficiency of SRAMs can be increased without cooperating with the memory refreshing circuits. However, the integration level of SRAMs is low; and cannot save data when the power is off. When an integrated chip having an Efuse intellectual property (IP) core and a SRAM IP core is first powered-on, the SRAM IP core needs to read the backup data stored in the Efuse IP core, and the time for reading the backup data is usually referred to as the system powering-up time of the chips. The chips are often used as memory devices in cellular phones, and laptop computers, etc. When the cellular phones and the laptop computers are turned on, the chips read the stored backup data. Thus, the system powering-up time of the chips directly affects the powering-up time of the cell phones and the laptop computers, and directly affects the user experience.

The Efuse IP core in a chip includes a plurality of Efuse cell circuits. FIG. 1 illustrates an existing Efuse circuit structure. As shown in FIG. 1, the Efuse cell often includes a fuse 1 and an NMOS transistor M11. The fuse 1 is connected to the drain of the NMOS transistor M11. Because the programming current of the fuse 1 is relatively large, the NMOS transistor has a relatively large size. Such a large size causes the drain-gate load of the NMOS transistor to be relatively large; and its charging/discharging speed is relatively slow. Thus, the NMOS transistor M11 has a relatively slow switching speed. Such a relatively slow switching speed causes the NMOS transistor M11 to be unable to synchronize with the system clock; and increases the system powering-up time.

The SRAM IP core in the chip includes a plurality of SRAM cell circuits. The mainstream structure of the existing SRAMs includes six transistors; and is often referred to as 6T SRAMs FIG. 2 illustrates an existing 6T SRAM.

As shown in FIG. 2, the 6T SRAM includes six transistors: M21, M22, M23, M24, M25 and M26 The transistor M21 and the transistor M24 form a bistable data latch. The data latch has two branches and two latching nodes to latch the data needed to be latched by the 6T SRAM. The transistor M21 and the transistor M23 are often PMOS transistors; and the sources of the transistor M21 and the transistor M23 are both connected to the power source. The transistor M22 and the transistor M24 are often NMOS transistors; and the sources of the transistor M22 and the transistor M24 are both connected to ground. The transistor M25 and the transistor M26 are pass transistors; and a signal WL is inputted into the gate of the transistor M25 and the gate of the transistor M26. The signal WL is used to control the on/off of the transistor M25 and the transistor M26 The signal BL and the signal \BL are the output signals of the 6T SRAM Thus, when the integrated chip having the Efuse IP core and the SRAM IP core is first powered-on, because the data reading by the SRAM IP core of the data stored in the Efuse IP core is unable to synchronize with the system clock, the system powering-up time is relatively long. Further, the MOS transistors in the chip take up relatively large areas. Thus, the area of the Efuse IP core is relatively large.

The disclosed Efuse bit cells and read/write methods thereof, and Efuse arrays are directed to solve one or more problems set forth above and other problems in the art.

BRIEF SUMMARY OF THE DISCLOSURE

One aspect of the present disclosure includes an Efuse bit cell. The Efuse bit cell includes a data latch configured to latch data of the Efuse bit cell, having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch; a selection controller configured to control connections between one terminal of the first branch and a power source and between one terminal of the second branch and the power source, another terminal of the first branch and another terminal of the second branch being connected to ground; a first diode and a second diode, one of the first diode and the second diode being configured to input a write data signal; and a pass unit configured to transmit data stored in the Efuse bit cell and output bit line signals.

Another aspect of the present disclosure includes a read/write method of an Efuse bit cell. The method includes providing an Efuse bit cell, including a data latch having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch; a selection controller configured to control connections between one terminal of the first branch and a power source and between one terminal of the second branch and the power source, another terminal of the first branch and another terminal of the second branch being connected to ground; a first diode and a second diode, one of the first diode and the second diode being configured to input a write data signal; and a pass unit configured to transmit data stored in the Efuse bit cell and output a bit line signal; turning on the selection controller to control connections between the first branch and the power source and between the second branch and the power source; turning on the pass unit to transmit data stored in the Efuse cell bit and output bit line signals, turning off the selection controller, turning off the pass unit; and programming the fuse.

Another aspect of the present disclosure includes an Efuse array. The Efuse array includes at least two parallel row lines and at least two parallel column lines forming a plurality of nodes, each node corresponding to an Efuse bit cell; a selection controller configured to control connections between one terminal of the first branch and a power source and between one terminal of the second branch and the power source, another terminal of the first branch and another terminal of the second branch being connected to ground; a first diode and a second diode, one of the first diode and the second diode being configured to input write data signals; and a pass unit configured to transmit data stored in the Efuse bit cell and output bit line signals; a plurality of row selectors configured to input address signals, each row selector being controlled on/off and each row selector being connected to one of the at least two row lines; and a plurality of column selectors configured to input address signals, each column selector being controlled on/off and each row selector being connected to one of the at least two column lines. The Efuse bit cell includes a data latch having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, when the integrated chip having the Efuse IP core and the SLAM IP core is first powered-on, because the data reading of by SRAM IP core of the data stored in the Efuse IP core is unable to synchronize with the system clock, the powering-up time is relatively long. Further, the MOS transistors in the chip take up relatively large areas, the area of the Efuse IP core is relatively large. Further, the existing 6T SRAMs are easy to be affected by DC noises. Thus, the anti-interference ability of the existing 6T SRAMs is relatively low.

Figure 1:
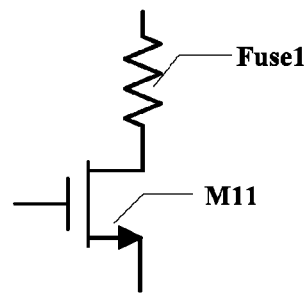
FIG. 1 illustrates an existing Efuse cell.
Figure 2:
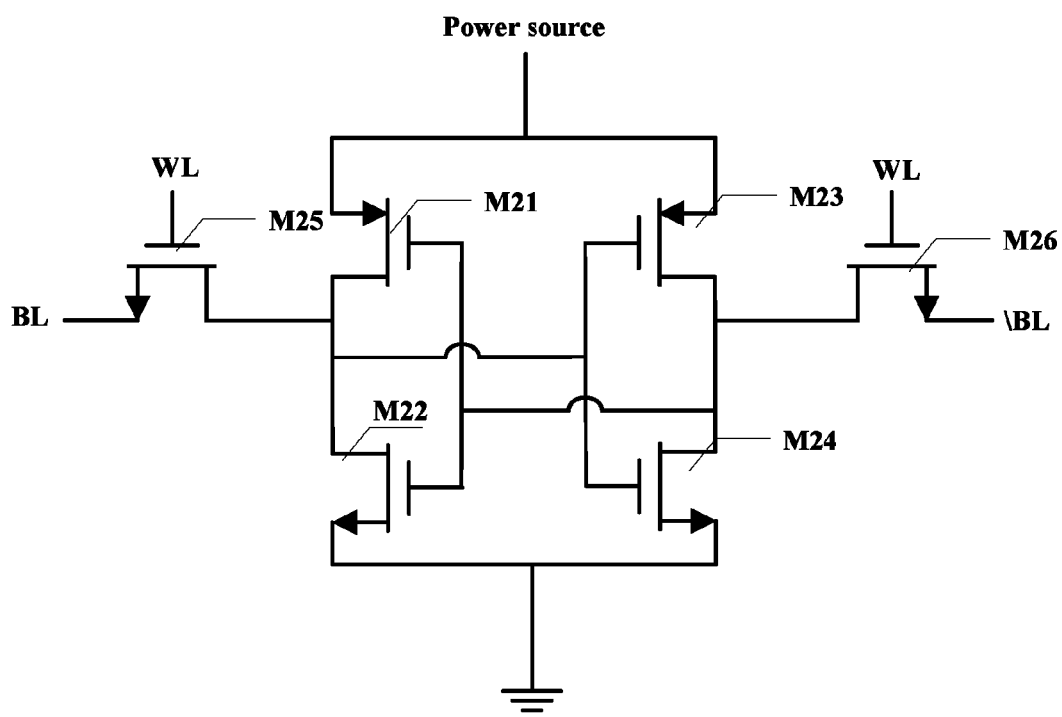
FIG. 2 illustrates an existing 6T SRAM.
Figure 3:
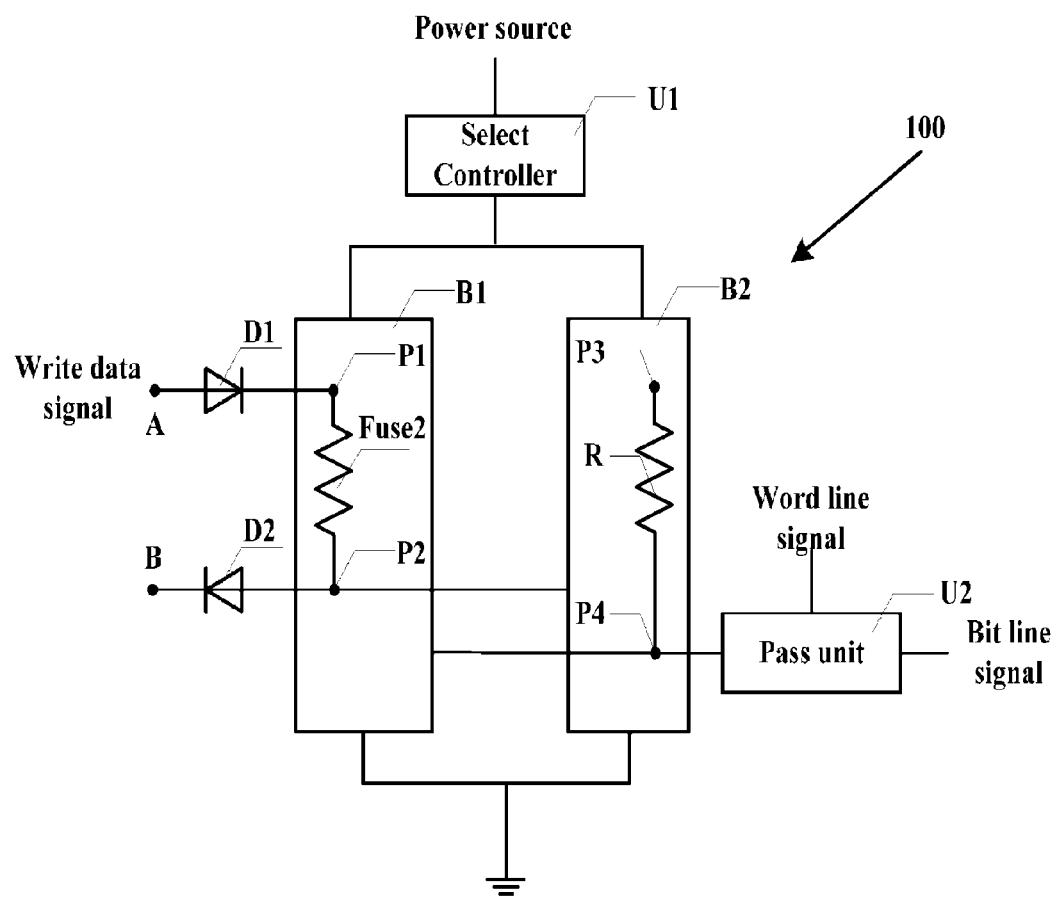
FIG. 3 illustrates an exemplary Efuse bit cell consistent with the disclosed embodiments.

The present disclosure provides Efuse bit cells and read/write methods thereof, and Efuse arrays. FIG. 3 illustrates an exemplary Efuse bit cell consistent with the disclosed embodiments.

As shown in FIG. 3, the Efuse bit cell 100 may include a data latch (not labeled). The date latch may be configured to latch data. The data latch may be a bistable data latch. Further, the data latch may include two branches, and often include four transistors, e.g., two PMOS transistors and two NMOS transistors (4T latch).

A fuse 2 may be disposed in the first branch B1 of the data latch. The two terminals of the fuse 2 may be connected to a PMOS transistor (not shown) and an NMOS transistor (not shown) in the first branch B1, respectively. The two terminals of the fuse 2 may be configured as a first latching node P1 and a second latching node P2, respectively.

Further, a resistor R may be disposed in the second branch B2 of the data latch. The two terminals of the resistor R may be connected to a PMOS transistor and an NMOS transistor in the second branch B2, respectively. The two terminals of the resistor R may be configured as a third latching node P3 and a fourth latching node P4, respectively.

The resistor R may be a constant resistor. The resistance of the resistor R may be between the resistance of the fuse 2 without being programmed and the resistance of the fuse 2 being programmed.

In one embodiment, if the fuse 2 is programmed, its resistance may be approximately 10 k$\Omega$. If the fuse 2 is not programmed, its resistance may be approximately 100$\Omega$. Thus, in one embodiment, the resistance of the resistor R may be approximately 2 k$\Omega$.

The second latching node P2 may be connected to the second branch B2. The fourth latching node P4 may be connected to the first branch B1.

According to the characteristics of the data latch, the data latched by the first latching node P1 and the data latched by the second latching node P2 may be identical. The data latched by the third latching node P3 and the data latched by the fourth latching node P4 may be identical. The data latched by the first latching node P1 and the data latched by the third latching node P3 may be opposite to each other.

Further, the Efuse bit cell 100 may also include a selection controller U1. The selection controller U1 may be connected between the data latch and a power source; and may be controlled to turn on/off. The selection controller U1 may be configured to control the connections between one terminal of the first branch B1 and the power source and between one terminal of the second branch B2 and the power source. The other terminal of the first branch B1 and the other terminal of the second branch B2 of the data latch may be connected to ground. In one embodiment, the selection controller U1 may be an MOS transistor, and may be referred as a virtual power source.

Further, the Efuse bit cell 100 may also include a first diode D1 and a second diode D2. The positive electrode A of the first diode D1 may be configured to input a write data signal. The negative electrode of the first diode D1 may be connected to the first latching node P1. The positive electrode of the second diode D2 may be connected to the second latching node P2.

In one embodiment, the negative electrode B of the second diode D2 may be connected to ground or a low level. The write data signal may sequentially pass through the first diode D1, the fuse 2 and the second diode D2 to form a conductive path.

Further, the Efuse bit cell 100 may also include a pass unit U2 (or a read out unit). The pass unit U2 may be connected to the fourth latching node P4; may be turned on/off by a read word line (RWL) signal. The pass unit U2 may be configured to transmit the data stored in the Efuse bit cell 100 to outside and output bit line signals.

Figure 4:
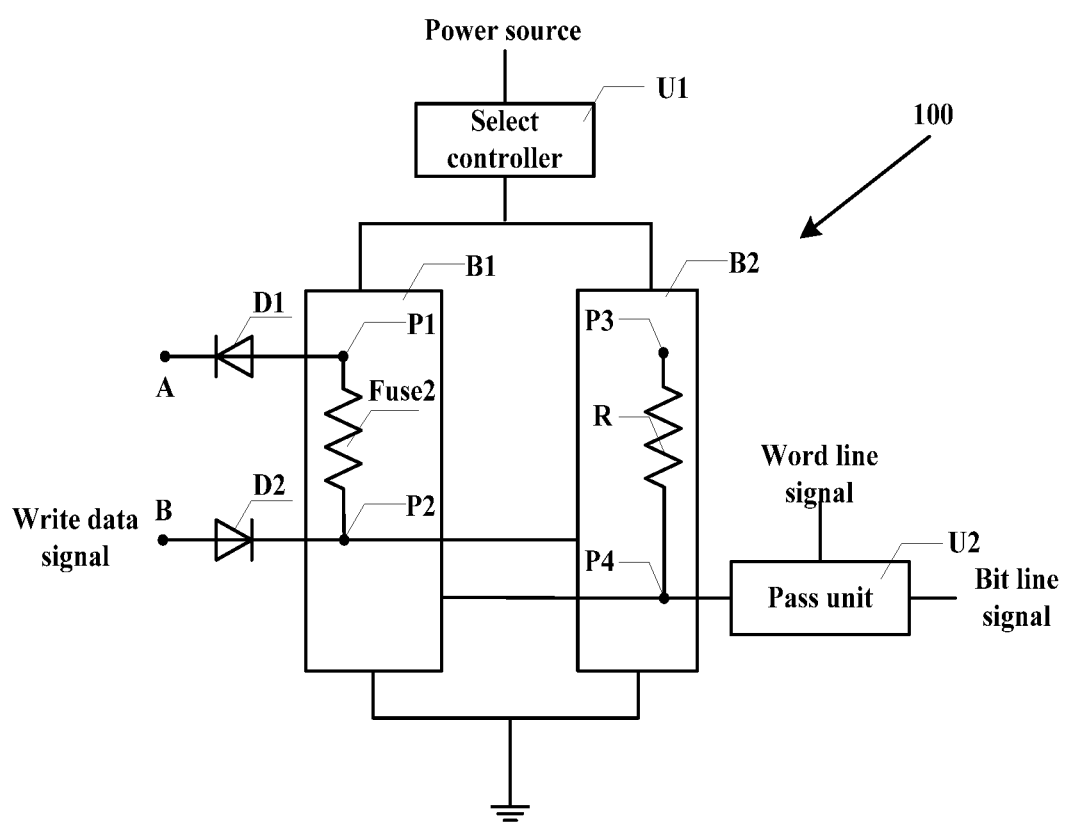
FIG. 4 illustrates another exemplary Efuse bit cell consistent with the disclosed embodiments.

FIG. 4 illustrates another exemplary Efuse bit cell consistent with the disclosed embodiments. Comparing with the Efuse bit cell 100 illustrated FIG. 3, the major difference in FIG. 4 may be that the positive electrode (B) of the second diode D2 may be configured to input a write data signal, and the negative electrode of the second diode D2 may be connected to the second latching node P2. Further, the positive electrode of the first diode D1 may be connected to the first latching point P1. Other components in FIG. 4 are similar to those of the Efuse bit cell 100 illustrated in FIG. 3.

Figure 5:
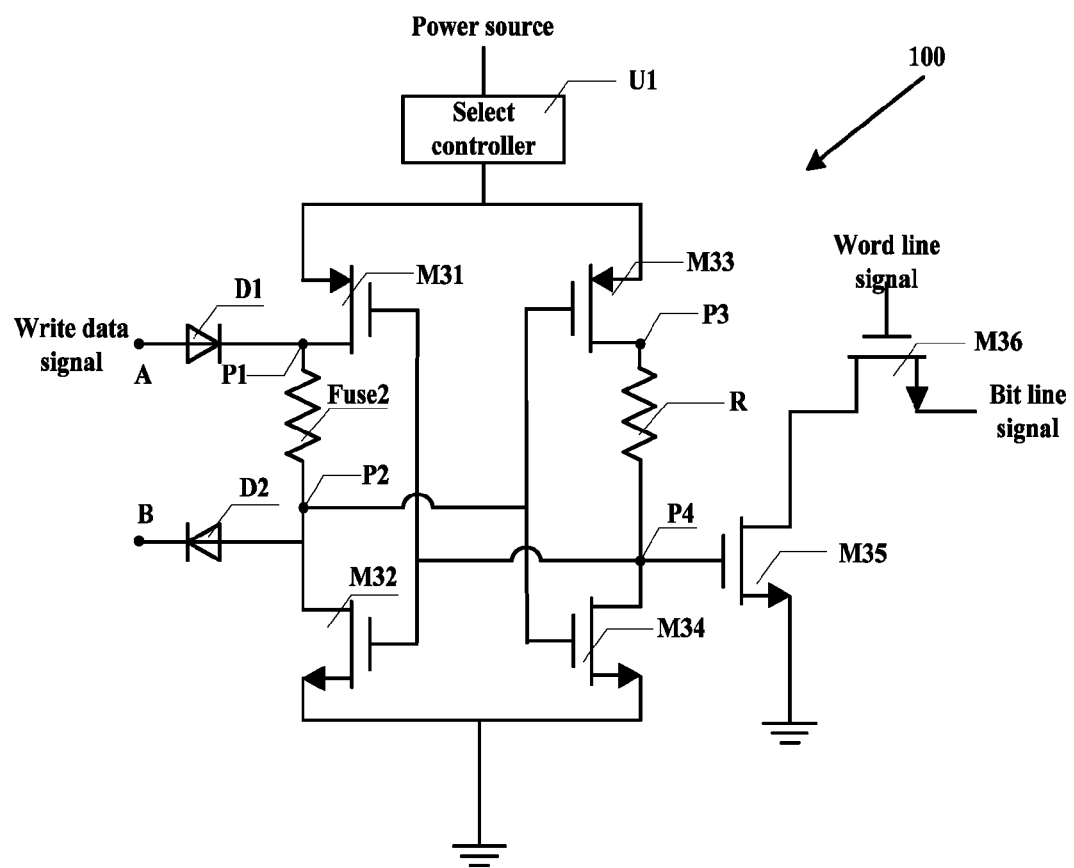
FIG. 5 illustrates circuit diagram of an exemplary Efuse bit cell consistent with the disclosed embodiments.

FIG. 5 illustrates an exemplary circuit diagram of the Efuse bit cell 100 illustrated in FIG. 3 consistent with the disclosed embodiments. As shown in FIG. 5, the data latch (not labeled) may include a first PMOS transistor M31, a first NMOS transistor M32, a second PMOS transistor M33 and a second NMOS transistor M34, i.e., 4T latch. The first branch B1 may include the first PMOS M31 and the first NMOS transistor M32. The second branch B2 may include the second PMOS transistor M33 and the second NMOS transistor M34.

Further, the drain of the first PMOS transistor M31 may be connected to the first latch node P1. The drain of the first NMOS transistor M32 may be connected to the second latching node P2. The drain of the second PMOS transistor M33 may be connected to the third latching node P3. The drain of the second NMOS transistor M34 may be connected to the fourth latching node P4. The source of the first PMOS transistor M31 and the source of the second PMOS transistor M33 may be connected together; and may be connected to the selection controller U1. The source of the first NMOS transistor M32 and the source of the second NMOS transistor M34 may be connected together; and may be connected to ground. The gate of the first PMOS transistor M31 and the gate of the first NMOS transistor M32 may be connected together; and may be connected to the fourth latching node P4 The gate of the second PMOS transistor M33 and the gate of the second NMOS transistor M34 may be connected together; and may be connected to the second latching node P2.

In one embodiment, the pass unit U2 (not labeled) may include a first pass transistor and a second pass transistor, i.e., a 2T readout unit. The first pass transistor may be connected between the fourth latching node P4 and the second pass transistor. The second pass transistor may be turned on/off by the word line signals, and may be configured to transmit the data of the Efuse bit cell; and output the bit line signals.

Specifically, as shown in FIG. 5, in one embodiment, the first pass transistor may be a third NMOS transistor M35. The gate of the third NMOS transistor M35 may be connected to the fourth latching node P4. The source of the third NMOS transistor M35 may be connected to ground. The drain of the third NMOS transistor M35 may be connected to the second pass transistor.

Further, as shown in FIG. 5, in one embodiment, the second pass transistor may be a fourth NMOS transistor M36. The drain of the fourth NMOS transistor M36 may be connected to the first pass transistor (M35). The gate of the fourth NMOS transistor M36 may be connected to the bit line signals. The source of the fourth NMOS transistor M36 may be configured to output the word line signals.

For illustrative purposes, the first pass transistor and the second pass transistor may be both NMOS transistors. Such a 2T readout structure may enable the Efuse bit cell 100 to have a high readout speed; and the read disturb may be avoided. In certain other embodiments, the first pass transistor and the second pass transistor may be any other electronic devices that can be controlled on/off.

Figure 8:
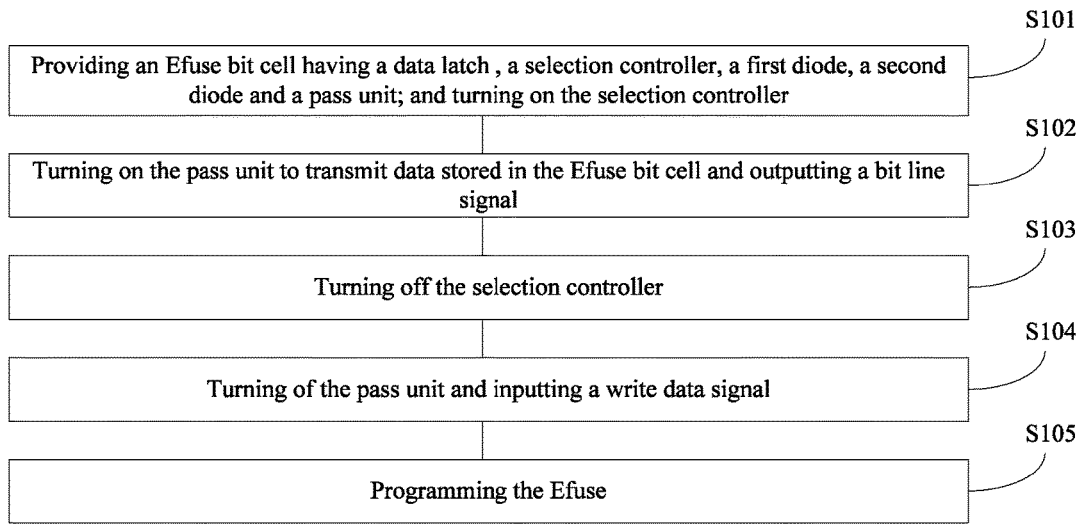
FIG. 8 illustrates an exemplary read/write method of an Efuse bit cell consistent with the disclosed embodiments.

As described previously, when the chip is first powered-on, each Efuse bit cell 100 may need to read the data of the fuse 2. FIG. 8 illustrates an exemplary read process of the Efuse bit cell 100 illustrated in FIG. 3 and the FIG. 5.

As shown in FIG. 8, at the beginning of the read process, the selection controller U1 may be turned on to turn on the connection between the first branch B1 and the second branch B2 of the data latch and the power source (S101). That is, the vitro power source may be connected to a power source. In one embodiment, as shown in FIG. 5, the connection between the source of the first PMOS transistor M31 and the power source and the connection between the source of the second PMOS transistor M33 and the power source may be turned on.

When the fuse 2 is previously programmed, the resistance of the fuse 2 may be greater than the resistance of the resistor R, the second branch B2 of the data latch may be turned on with the power source prior to the first branch B1 of the data latch. The second branch B2 having the resistor R may be connected to the power source and ground to form a connected path; and the data latched by the third latching node P3 and the data latched by the fourth latching node P4 may be read as a low level. Because the first branch B1 of the data latch having the fuse 2 may not be turned on to connect to the power source and ground, the data latched by the first latching node P1 and the data latched by the second latching node P2 may be read as a high level.

Specifically, referring to FIG. 5, when the fuse 2 is previously programmed, the resistance of the fuse 2 may be greater than the resistance of the resistor R, the second branch B2 of the data latch may be turned on with the power source prior to the first branch B1 of the data latch. The second branch B2 having the resistor R may be connected to the power source and ground to form a connected path. Thus, the second PMOS transistor M33 and the second NMOS 10 transistor M34 may be turned on; and may have relative low voltage drops Thus, the data latched by the third latching node P3 and the data latched by the fourth latching node P4 may be read as the low level. At the same time, because the first branch B1 of the data latch having the fuse 2 may not be turned on to connect to the power source and ground, the first PMOS transistor M31 and the first NMOS transistor M32 may be turned off; and the fuse 2 may be floated Thus, the data latched by the first latching node P1 and the data latched by the second latching node P2 may be read as the high level.

When the fuse 2 is not programmed, the resistance of the fuse 2 may be smaller than the resistance of the resistor R, the first branch B1 of the data latch may be turned on with the power source prior to the second branch B2 of the data latch. The first branch B1 having the fuse 2 may be connected to the power source and ground to form a connected path, and the data latched by the first latching node P1 and the data latched by the second latching node P2 may be read as a low level. Because the second branch B2 of the data latch having the resistor R may not be turned on to connect to the power source and ground, the data latched by the third latching node P3 and the data latched by the fourth latching node P4 may be read as a high level.

Specifically, as shown in FIG. 5, when the fuse 2 is not programmed, the resistance of the fuse 2 may be smaller than the resistance of the resistor R; and the first branch B1 of the data latch may be turned on with the power source prior to the second branch B2 of the data latch. The first branch B1 having the fuse 2 may be connected to the power source and ground to form a connected path. However, the second branch B2 of the data latch having the resistor R may not be turned on to connect to the power source and ground. Thus, the data latched by the first latching node P1 and the data latched by the second latching node P2 may be read as a low level; and the data latched by the third latching node P3 and the data latched by the fourth latching node P4 may be read as a high level.

Further, the read process may include turning on the pass unit U2 by setting the word line signals at a high level (S102). The data latched by the fuse bit cell 100 may be transmitted to the pass unit U2; and a bit line signal may be outputted. Referring to FIG. 5, the pass unit U2 may be turned on by turning on the fourth NMOS transistor M36.

Specifically, if the data latched by the second latching node P2 is at a low level, the data latched by the fourth latching node P4 may be at a high level. The third NMOS transistor M35 may be turned on, the bit line signal may read the data as a low level. If the data latched by the second latching point P2 is at the high level, the data latched by the fourth latching point P4 may be at the low level. The third NMOS transistor M35 may be turned off, the bit line signal may read the data as a high level. Thus, the data status read by the bit line signals may be identical to the data latched by the second latching node P2.

Further, as described previously, when the Efuse bit cell is used as an OTP device, the fuse may need to be programmed to save the required backup data of the chip. FIG. 8 illustrates an exemplary write method to the fuse 2 of the Efuse bit cell 100 illustrated in FIG. 3 and the FIG. 5 after the read process.

As shown FIG. 9, the write process may include turning off the selection controller U1 (S103) By turning off the selection controller U1, the first branch B1 and the second branch B2 of the data latch may be turned off from the power source. That is, the virtual power source may be floated. Specifically, referring to FIG. 5, by controlling the connection between the first PMOS transistor M31 with the power source and the connection between the second PMOS transistor M33 and the power source, the selection controller U1 may be turned off.

Further, the write method may also include turning off the pass unit U2; and inputting a write data signal to the positive electrode A of the first diode D1 (104). Then, the write data signal may be transmitted to the fuse 2 and the second diode D2; and the fuse 2 may be programmed. Specifically, referring to FIG. 5, the word line signal may be set at a low level; and the fourth NMOS transistor M36 may be turned off.

In certain other embodiments, a write method for the fuse bit cell 100 illustrated in FIG. 4 may include turning off the selection controller U1; and turning off the first branch B1 and the second branch B2 of the data latch from the power source. Then, the pass unit U2 may be turned off; and the write data signal may be inputted into the positive electrode B of the second diode D2; and may be transmitted to fuse 2 and the first diode D1 The fuse 2 may be programmed.

Thus, in the disclosed embodiments, the fuse may be disposed in the first branch of the data latch; and a resistor may be dispose in the second branch of the data latch. The fuse and the resistor may have resistance differences under the programmed status and non-programmed status. Thus, the disclosed Efuse bit cell may be able to read the latched data under different status as a normal SRAM.

There may be two methods for performing data write operation to the disclosed Efuse fit cells. For the first method, the write data signal may be inputted into the first diode; and the write data signal may sequentially go through the first diode, the fuse and the second diode to form a connection path, and the fuse may be programmed. For the second method, the positive electrodes and the negative electrodes of the first diode and the second diode may be inverted; and the write data signal may be inputted into the positive electrode of the second diode.

Therefore, when the integrated chip having the disclosed Efuse bit cell is first powered-on, the data stored in the fuse included in the Efuse bit cell may be read. Because the pass unit may be controlled by the word line signal, the word line signal may be synchronized with the system clock of the integrated chip. Accordingly, the data reading of the fuse included in the Efuse bit cell may also be synchronized with the system clock of the chip. Thus, the system powering-up time of the chip may be improved.

Further, for the disclosed Efuse bit cell and the SRAM, it may not only program the fuse, but also it is able to achieve the read/write function of the existing SRAM. Thus, the existing Efuse IP core and the SRAM IP core may be integrated into one IP core; and the integration level may be increased.

Further, the output signals BL and \BL of the existing 6T SRAM may be directly connected to two corresponding latching nodes, which is sensitive to DC noises; and is easy to invert the latching status of the latching points. Thus, the anti-interference ability may not be acceptable. The pass unit of the disclosed Efuse bit cell may include a third NMOS transistor and a fourth NMOS transistor. When the data latched in the Efuse bit unit is read, the effect of the bit line signals at the output terminal of the fourth NMOS transistor to the fourth latching node may be effectively avoided, and the inversion of the latching data may be avoided. Thus, the read disturb may be avoided.

Further, a first diode and a second diode may be included in the Efuse bit cell. When the Efuse bit cell is performing a write operation, the written data may flow along a single direction. Thus, the disclosed embodiments may increase the anti-interference ability of the circuit.

Figure 6:
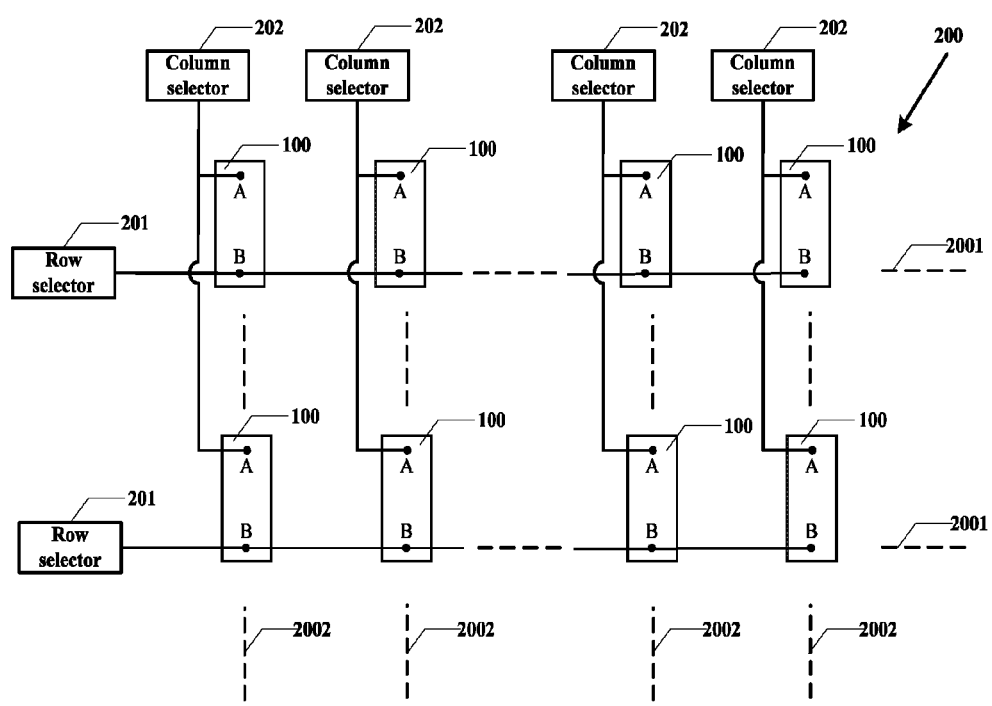
FIG. 6 illustrates an exemplary Efuse array consistent with the disclosed embodiments.

FIG. 6 illustrates an exemplary Efuse array consistent with the disclosed embodiments. The Efuse array may be configured to receive the address signals outputted from an address decoder.

As shown in FIG. 6, the Efuse array 200 may include at least two parallel row lines 2001 and at least two parallel column lines 2002. The Efuse array 200 may include a plurality of disclosed Efuse bit cells 100 distributed into an array Each of the plurality of Efuse bit cells 100 may correspond to one node formed by the corresponding row line 2001 and the corresponding column line 2002.

Further, the Efuse array 200 may also include a plurality of row selectors 201. Each of the plurality of row selectors 201 may be turned on/off. Each of the plurality of row selectors 201 may be connected to one of the plurality of row lines 2001.

Further, the Efuse array 200 array may also include a plurality of column selectors 202. Each of the plurality of column selectors 202 may be turned on/off. Each of the plurality of column selectors 202 may be connected to one of the plurality of column lines 2002.

The negative electrodes "B" of the second diodes D2 (referring to FIG. 3) of all the Efuse bit cells 100 in each row line 2001 may be connected together; and connected to the input terminal of the row selector 201 corresponding to the row line 2001. The positive electrodes "A" of the first diodes D1 (referring to FIG. 3) of all the Efuse bit cells 100 in each column line 2002 may be connected together, and connected to the input terminal of the column selector 202 corresponding to the column line 2002.

The row selectors 201 and the column selectors 202 may be configured to the input address signals. The address signals may be from output terminals of the peripheral decoding circuit (not shown) of the disclosed Efuse array 200; and may be used to select corresponding Efuse bit cell 100 in the Efuse array 200.

In one embodiment, a row selector 201 may include an NMOS transistor (not shown). The drain of the NMOS transistor may correspond to the output terminal of the row selector 201. The source of the NMOS transistor may be connected to ground. The gate of the NMOS transistor may correspond to the input terminal of the row selector 201.

In one embodiment, a column selector 202 may include a PMOS transistor (not shown). The drain of the PMOS transistor may correspond to the output terminal of the column selector 202. The source of the PMOS transistor may be connected to ground. The gate of the PMOS transistor may correspond to the input terminal of the column selector 202.

Figure 7:
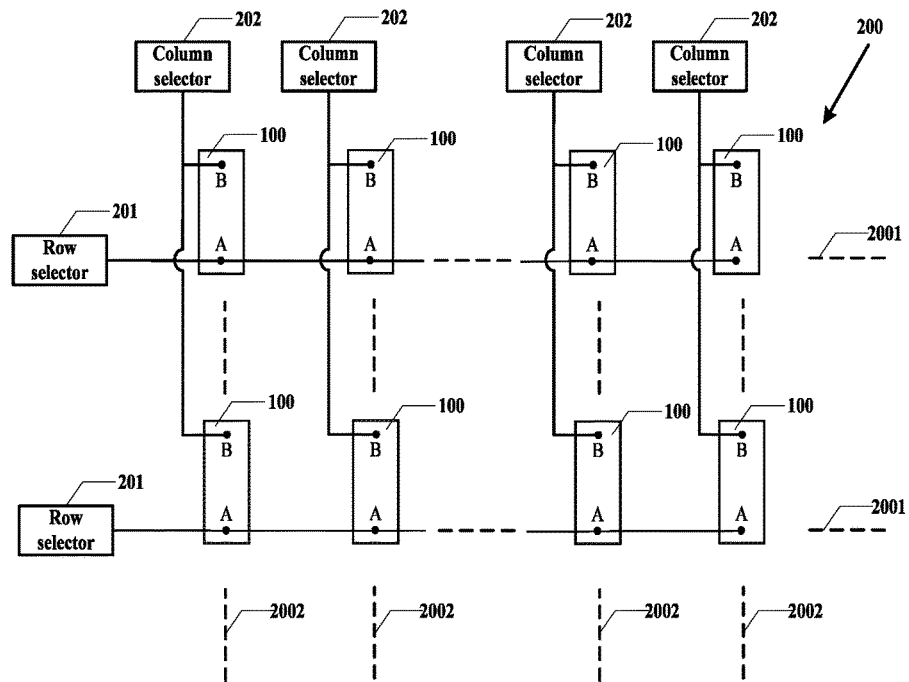
FIG. 7 illustrates another exemplary Efuse array consistent with the disclosed embodiments.

FIG. 7 illustrates another exemplary Efuse array consistent with the disclosed embodiments. As shown in FIG. 7, the Efuse array 200 may include at least two parallel row lines 2001 and at least two parallel column lines 2002. The Efuse array 200 may include a plurality of disclosed Efuse bit cells 100 distributed into an array. Each of the plurality of Efuse bit cells 100 may correspond to one node formed by the corresponding row line 2001 and the corresponding column line 2002.

Further, the Efuse array 200 may also include a plurality of row selectors 201. Each of the plurality of row selectors 201 may be turned on/off. Each of the plurality of row selectors 201 may be connected to one of the plurality of row lines 2001.

Further, the Efuse array 200 may also include a plurality of column selectors 202. Each of the plurality of column selectors 202 may be turned on/off. Each of the plurality of column selectors 202 may be connected to one of the plurality of column lines 2002.

The positive electrodes (B) of the second diodes D2 (referring to FIG. 3) of all the Efuse bit cells 100 in each row line 2001 may be connected together, and connected to the input terminal of the row selector 201 corresponding to the row line 2001. The negative electrodes (A) of the first diodes D1 (referring to FIG. 3) of all the Efuse bit cells 100 in each column line 2002 may be connected together; and connected to the input terminal of the column selector 202 corresponding to the column line 2002.

The row selectors 201 and the column selectors 202 may be configured to the input address signals. The address signals may be from the output terminal of the peripheral decoding circuit (not shown) of the disclosed Efuse array 200, and may be used to select corresponding Efuse bit cell 100 in the Efuse array 200.

In one embodiment, a row selector 201 may include an NMOS transistor (not shown). The drain of the NMOS transistor may correspond to the output terminal of the row selector 201. The source of the NMOS transistor may be connected to ground. The gate of the NMOS transistor may correspond to the input terminal of the row selector 201.

In one embodiment, a column selector 202 may include a PMOS transistor (not shown). The drain of the PMOS transistor may correspond to the output terminal of the column selector 202. The source of the PMOS transistor may be connected to ground. The gate of the PMOS transistor may correspond to the input terminal of the column selector 202.

In the existing techniques, the Efuse array having "m" rows and "n" columns needs (m×n) NMOS transistors. In disclosed Efuse array, the Efuse array having "m" rows and "n" columns may only need (m+n) MOS transistors ("m" NMOS transistors and "n" PMOS transistors). If the programming current of the fuse is relatively large, the corresponding MOS transistor may have a relatively large size. Thus, according to the disclosed embodiments, the number of the MOS transistors having the relatively large size may be reduced. Therefore, the area of the Efuse array may be reduced, and the integration level of the chip having the disclosed Efuse array may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. An Efuse bit cell, comprising:
   a data latch configured to latch data of the Efuse bit cell, having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch;
   a selection controller configured to control connections between one terminal of the first branch and a power source and between one terminal of the second branch and the power source, another terminal of the first branch and another terminal of the second branch being connected to ground;
   a first diode and a second diode, one of the first diode and the second diode being configured to input a write data signal, a terminal of the first diode being connected to the first latching node, and a terminal of the second diode being connected to the second latching node; and
   a pass unit being connected to the fourth latching node and configured to transmit data stored in the Efuse bit cell and output a bit line signal.
2. The Efuse bit cell according to claim 1, wherein:
   a positive electrode of the first diode is configured to input the write data signal;
   a negative electrode of the first diode is connected to the first latching node; and
   a positive electrode of the second diode is connected to the second latching node.
3. The Efuse bit cell according to claim 1, wherein:
   a positive electrode of the second diode is configured to input the write data signal;
   a negative electrode of the second diode is connected to the second latching node; and
   a positive electrode of the first diode is connect to the first latching node.

4. The Efuse bit cell according to claim 1, wherein:
a resistance of the resistor is between a resistance of the fuse without being programmed and a resistance of the fuse being programmed.

5. The Efuse bit cell according to claim 1, wherein:
data latched by the first latching node is identical to data latched by the second latching node;
data latched by the second latching node is identical to data latched by the fourth latching node; and
the data latched by the first latching node is opposite to the data latched by the third latching node.

6. The Efuse bit cell according to claim 1, wherein the data latch comprises:
a first PMOS transistor;
a first NMOS transistor;
a second PMOS transistor; and
a second NMOS transistor,
wherein:
the first branch includes the first PMOS transistor and the first NMOS transistor;
the second branch includes the second PMOS transistor and the second NMOS transistor;
a drain of the first PMOS transistor is connected to the first latching node;
a drain of the first NMOS transistor is connected to the second latching node;
a drain of the second PMOS transistor is connected to the third latching node;
a drain of the second NMOS transistor is connected to the fourth latching node;
a source of the first PMOS transistor and a source of the second PMOS transistor are connected together, and connected to the selection controller;
a source of the first NMOS transistor and a source of the second NMOS transistor are connected together, and connected to ground;
a gate of the first PMOS transistor and a gate of the first NMOS transistor are connected together, and connected to the fourth latching node; and
a gate of the second PMOS transistor and a gate of the second NMOS transistor are connected together, and connected to the second latching node.

7. The Efuse bit cell according to claim 1, wherein the pass unit comprises:
a first pass transistor; and
a second pass transistor,
wherein:
the first pass transistor is connected between the fourth latching node and the second pass transistor;
the second pass transistor is turned on/off by a word line signal, and configured to transmit data stored in the Efuse bit cell and output a bit line signal.

8. The Efuse bit cell according to claim 7, wherein:
the first pass transistor is a third NMOS transistor;
a gate of the third NMOS transistor is connected to the fourth latching node;
a source of the third NMOS transistor is connected to ground; and
a drain of the third NMOS transistor is connected to the second pass transistor.

9. A read/write method of an Efuse bit cell, comprising:
providing an Efuse bit cell, including a data latch having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch; a selection controller configured to control connections between one terminal of the first branch and a power source and between one terminal of the second branch and the power source, another terminal of the first branch and another terminal of the second branch are connected to ground; a first diode and a second diode, one of the first diode and the second diode being configured to input a write data signal, a terminal of the first diode being connected to the first latching node, and a terminal of the second diode being connected to the second latching node; and a pass unit being connected to the fourth latching node and configured to transmit data stored in the Efuse bit cell and output a bit line signal;
turning on the selection controller to control connections between the first branch and a power source and between the second branch and the power source;
turning on the pass unit to transmit data stored in the Efuse cell bit and output bit line signals;
turning off the selection controller;
turning off the pass unit; and
programming the fuse.

10. The method according to claim 9, wherein, when the first latching node is connected to a positive electrode of the first diode, the programming of the fuse comprises:
inputting a write data signal to a positive electrode of the first diode; and
transmitting the write data signal to the fuse and the second diode.

11. The method according to claim 9, wherein, when the first latching node is connected to a negative electrode of the first diode, the programming of the fuse comprises:
inputting a write data signal to the negative electrode of the second diode; and
transmitting the write data signal to the fuse and the first diode.

12. The method according to claim 9, wherein, the selection controller comprising a first PMOS transistor and a second PMOS transistor and the pass unit comprising a first pass transistor and a second pass transistor, the step of turning on the selection controller comprises:
turning on a connection between a source of the first PMOS transistor and a power source and a connection between a source of the second PMOS transistor and the power source;
setting a word line signal at a high level to turn on the second pass transistor;
turning on the first pass transistor of the pass unit if data stored at the second latching node is at a low level; and
turning off the first pass transistor if the data stored at the second latching node is at a high level.

13. The method according to claim 12, wherein, the first pass transistor being a third NMOS transistor and the second pass transistor being a fourth NMOS transistor, the step of turning on the selection controller comprises:
turning on the connection between the source of the first PMOS transistor and a power source and the connection between the source of the second PMOS transistor and the power source;
setting the word line signal at a high level;
turning on the third NMOS transistor if the second latching node is at a low level; and
turning off the third NMOS transistor if the second latching node is at a high level.

14. The method according to claim 13, wherein the step of turning off the pass unit comprises:
  setting the word line signal at a low level to turn off the second pass transistor.

15. The method according to claim 13, wherein turning off the pass unit comprises:
  setting the word line signal at a low level to turn off the fourth pass transistor.

16. An Efuse array, comprising:
  at least two parallel row lines and at least two parallel column lines, forming a plurality of nodes, each node corresponding to an Efuse bit cell,
  wherein the Efuse bit cell includes a data latch having two branches with a fuse disposed in a first branch and a resistor disposed in a second branch, two terminals of the fuse being configured as a first latching node and a second latching node, respectively, two terminals of the resistor being configured as a third latching node and a fourth latching node, respectively, the second latching node being connected to the second branch and the fourth latching node being connected to the first branch; a selection controller configured to control connections between one terminal of the first branch and a power source and between one terminal of the second branch and the power source, another terminal of the first branch and another terminal of the second branch being connected to ground; a first diode and a second diode, one of the first diode and the second diode being configured to input a write data signal, a terminal of the first diode being connected to the first latching node, and a terminal of the second diode being connected to the second latching node; and a pass unit being connected to the fourth latching node and configured to transmit data stored in the Efuse bit cell and output a bit line signal;
  a plurality of row selectors configured to input address signals, each row selector being controlled on/off and each row selector being connected to one of the at least two row lines; and
  a plurality of column selectors configured to input address signals, each column selector being controlled on/off and each row selector being connected to one of the at least two column lines.

17. The Efuse array according to claim 16, when the first latching node being connected to a positive electrode of the first diode, wherein:
  negative electrodes of the second diodes of all Efuse bit cells in each row line are connected together and connected to an input terminal of a corresponding row selector; and
  positive electrodes of the first diodes of all Efuse bit cells in each column line are connected together and connected to an input terminal of a corresponding column selector.

18. The Efuse array according to claim 16, when the first latching node being connected to a negative electrode of the first diode, wherein:
  positive electrodes of the second diodes of all Efuse bit cells in each column line are connected together and connected to an input terminal of a corresponding column selector; and
  negative electrodes of the first diodes of all Efuse bit cells in each row line are connected together and connected to an input terminal of a corresponding row selector.

19. The Efuse array according to claim 16, wherein the row selector comprises:
  an NMOS transistor,
  wherein:
    a drain of the NMOS transistor is corresponding to an output terminal of the row selector;
    a source of the NMOS transistor is connected to ground; and
    a gate of the NMOS transistor is corresponding to the input terminal of the row selector.

20. The Efuse array according to claim 16, wherein the column selector comprises:
  a PMOS transistor,
  wherein:
    a drain of the PMOS transistor is corresponding to an output terminal of the column selector;
    a source of the PMOS transistor is connected to ground; and
    a gate of the PMOS transistor is corresponding to the input terminal of the column selector.

* * * * *